United States Patent [19]

Hoffman et al.

[11] 4,003,035

[45] Jan. 11, 1977

[54] COMPLEMENTARY FIELD EFFECT TRANSISTOR SENSE AMPLIFIER FOR ONE TRANSISTOR PER BIT RAM CELL

[75] Inventors: Charles Robert Hoffman, Tempe; William Walter Lattin, Phoenix, both of Ariz.

[73] Assignee: Motorola, Inc., Chicago, Ill.

[22] Filed: July 3, 1975

[21] Appl. No.: 593,072

[52] U.S. Cl. .................. 340/173 FF; 340/173 CA
[51] Int. Cl.² .................. G11C 7/06; G11C 11/24
[58] Field of Search ......................... 307/291, 238; 340/173 R, 173 CA, 173 FF

[56] References Cited

UNITED STATES PATENTS

| | | | |
|---|---|---|---|
| 3,678,473 | 7/1972 | Wahlstrom | 340/173 CA |
| 3,771,147 | 11/1973 | Boll et al. | 340/173 CA |
| 3,806,898 | 4/1974 | Askin | 340/173 CA |
| 3,838,295 | 9/1974 | Lindell | 340/173 CA |
| 3,868,656 | 2/1975 | Stein et al. | 340/173 FF |

*Primary Examiner*—Stuart N. Hecker
*Attorney, Agent, or Firm*—Charles R. Hoffman

[57] ABSTRACT

A random access memory includes a plurality of one-transistor storage cells. A plurality of sense-write conductors are included, each connected to a plurality of storage cells in a row of storage cells. A plurality of regenerative sense amplifiers are each coupled to two sense-write conductors. A one-transistor dummy storage cell is connected to each sense-write conductor. Read-write circuitry is coupled between a data conductor of the memory chip and one of the regenerative sense amplifiers for each of the rows, respectively. The dummy storage cell is selected whenever a storage cell on the opposite side of the regenerative sense amplifier is selected after redistribution of charge initially stored in the selected storage cell onto the sense-write conductor takes place. The sense voltage resulting from the charge redistributed on the opposite sense-write conductor is subsequently amplified by the sense amplifier, and provided in inverted and noninverted form on the two respective sense-write conductors. A CMOS transmission gate clocked by a first control signal and its logical complement balances the two sense-write conductors to precisely the same voltage. First and second clocked CMOS inverters are cross-coupled to form a label with its output nodes each coupled, respectively, to one of a pair of the sense-write conductors. The clocking of the latch circuit is performed by a second clock signal and its logical complement delayed somewhat from the first clock signal and its logical complement to effectively electrically isolate the pair of sense-write conductors during the balancing and sensing charge redistribution operations.

14 Claims, 3 Drawing Figures

4,003,035

COMPLEMENTARY FIELD EFFECT TRANSISTOR SENSE AMPLIFIER FOR ONE TRANSISTOR PER BIT RAM CELL

BACKGROUND OF THE INVENTION

1. Field of the Invention

This invention relates to read-write circuitry for semiconductor memories.

2. Description of the Prior Art

Single transistor storage cells have been recently utilized to implement random access memories. The single transistor storage cells usually include a MOSFET having its gate connected to a selection conductor, its drain connected to a sense-write conductor and its source connected to a storage node. The storage cell also includes a storage capacitor connected between the storage node and a common voltage supply conductor. In order to achieve a large number of storage cells in a small amount of semiconductor chip area it is desirable that the storage capacitor be very small. A plurality of such storage cells are connected to a single sense-write conductor and thereby comprise one row of many rows forming a rectangular array of storage cells. Consequently, the capacitance associated with the sense-write conductor is very large compared to that of the storage capacitor of each storage cell. Sensing is accomplished by selection of the storage cell by turning on the MOSFET, and causing the charge stored on the storage capacitor of the selected storage cell to be redistributed to the capacitance of the sense-write conductor, resulting in a relatively small voltage transition of the sense-write conductor. Consequently, sensitive sense amplifiers have been developed which are capable of sensing and amplifying such small voltage transitions. Read-write circuitry is normally coupled directly to the sense-write conductors. However, such read-write circuitry increases the capacitance of the sense-write conductor even more, and reduces the size of the voltage transition achieved by selecting a storage cell. Heretofore, the solution has been to increase the size of the storage capacitor of each storage cell, thereby increasing the size and cost of the semiconductor memory or by increasing the sensitivity of the sense amplifier, which normally involves more complex, more area consuming, and consequently, more expensive sense amplifier circuitry, which in turn increases the cost of the memory product.

SUMMARY OF THE INVENTION

It is an object of this invention to provide a semiconductor memory system wherein complementary CMOS sense amplifier circuitry is coupled to a pair of sense-write conductors, and a complementary transmission gate clocked by a first signal and its complement is used to balance the pair of sense-write conductors, and coupling circuitry clocked by a second signal and its complement is used to electrically isolate the two sense-write conductors during the balancing and sensing charge redistribution operations.

Briefly described, the invention is a semiconductor memory having a plurality of storage cells and a sense-write conductors coupled to a plurality of the storage cells. A complementary sense amplifier circuit is coupled to one of the sense-write conductors. A dummy storage cell having a storage node is also coupled to the sense-write conductor. The complementary sense amplifier circuit coupled to the sense-write conductor acts to amplify a sense signal imparted to the sense-write conductor by a selected storage cell and also acts to isolate the sense-write conductor so that it is electrically floating at times other than during a read operation or a write operation. In one embodiment the complementary sense-amplifier is also coupled to a second sense-write conductor, and includes balancing circuitry including a complementary field effect transistor transmission gate responsive to a first clock signal for balance both sense-write conductors.

DESCRIPTION OF THE INVENTION

Figure 2:
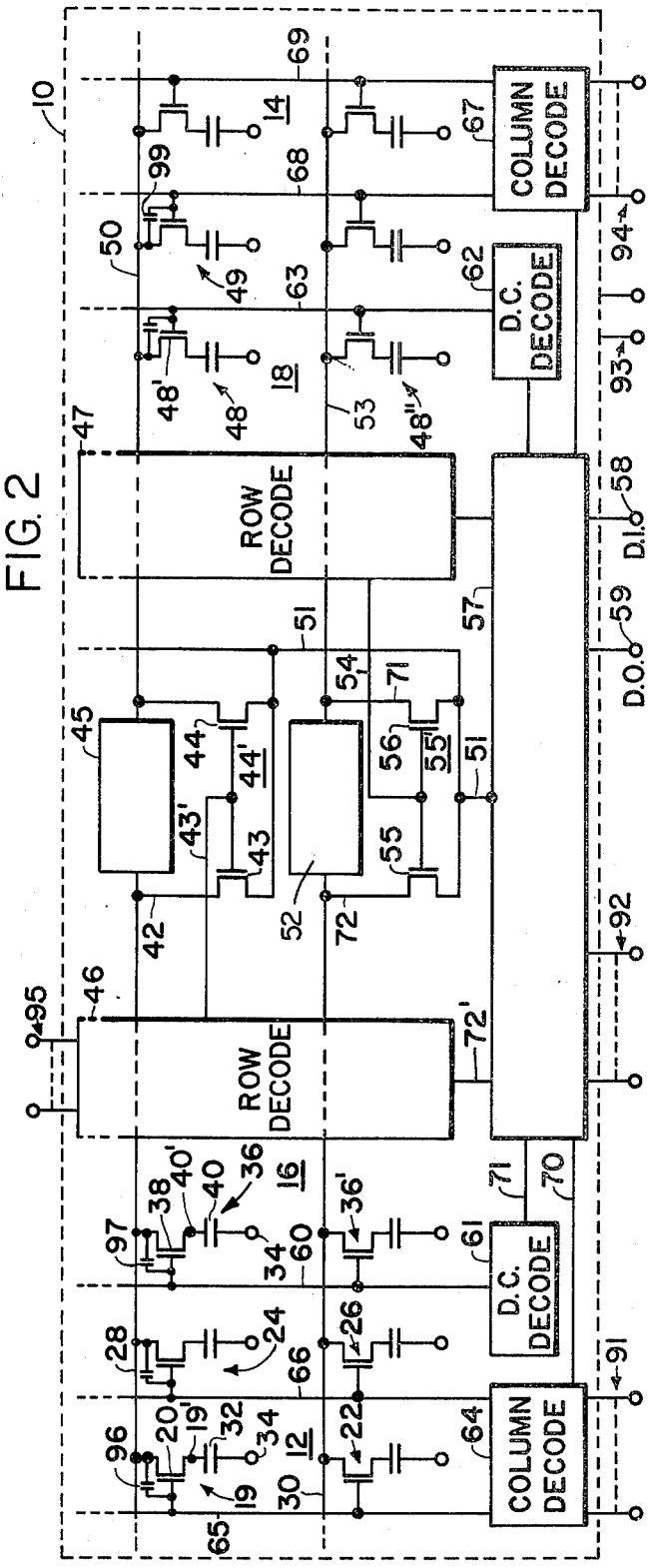
FIG. 2 is a partial schematic diagram of a semiconductor memory chip in accordance with the invention.

Referring first to FIG. 2, it is seen that semiconductor memory chip 10 includes a left hand array 12 of one transistor memory storage cells including storage cells 19 and 24 connected to sense-write conductor 28 and storage cells 22 and 26 coupled to sense-write conductor 30. The dotted lines indicate expansion of the number of rows and columns of identical storage cells. Memory chip 10 also includes a right hand array 14 including a plurality of identical storage cells such as 49 connected to sense-write conductor 50 and a plurality of one transistor storage cells connected to sense-write conductor 53.

Again, the dotted lines indicate expansion of rows and columns of storage cells. The construction of the one transistor memory cell is described with reference to memory cell 19, which includes MOSFET 20 and storage capacitor 32. MOSFET 20 has its drain connected to sense-write conductor 28 and its source connected to a storage node 19' and its gate connected to column selection conductor 65. Storage capacitor 32 has one electrode connected to the source of MOSFET 20 and its other electrode connected to common voltage conductor 34.

It is seen that all of the storage cells in arrays 12 and 14 are arranged in rows and columns, and that in each array all of the storage cells in a given row have the drain of their respective MOSFETs connected to the same sense-write conductor. It is also seen that the gate of each MOSFET in a given column is connected to the same column selection conductor, such as column selection conductors 65, 66, 68 or 69.

Semiconductor memory chip 10 also includes two columns of dummy storage cells. Column 16 includes dummy storage cells 36 and 36', while column 18 includes dummy storage cells 48 and 48''. There is one dummy storage cell for each row of storage cells in each of arrays 12 and 14.

Each of the dummy storage cells, including dummy storage cell 36, is schematically the same as the storage cells in arrays 12 and 14. For example, dummy storage cell 36 includes MOSFET 38 having its drain connected to sense-write conductor 28, its gate connected to dummy storage cell selection conductor 60, and its source connected to storage node 40' and to one electrode of storage capacitor 40 and the other electrode of which is connected to common voltage conductor 34. The dummy storage cell in each row of each array is connected to the sense-write conductor, such as 28, 30, 50 or 53 of that particular row of the respective array.

Each of the column selection conductors such as 65 and 66 in array 12 is driven by column decode circuitry 64. The structure of the circuitry included in column decode circuitry 64 is readily implementable using techniques similar to ones known to those skilled in the art, and typically includes decode gates and address inverters. For example, see U.S. Pat. No. 3,760,380 assigned to the present assignee, by Hoffman et al.

The inputs to the address inverters are the address inputs 91, 94, to MOS memory chip 10. Similarly, the column selection conductor such as 68 and 69 of right hand array 14 are connected to column decode circuitry 67, which is similar to the circuitry of column decode circuitry 64, except that different address inputs are connected thereto.

A sense amplifier, such as 45, is connected between the sense-write conductors of each array for each row in the memory. Sense-amplifier 45 is connected between sense-write conductor 28 and sense-write conductor 50. Similarly, sense amplifier 52 is connected between sense-write conductors 30 and 53. Incidentally, the dotted extension of the sense-write conductors and the column selection conductors in FIG. 2 indicate that the memory array and the decode section are expandable in both the horizontal and vertical directions.

Associated with each row of storage cells and the respective sense amplifier is an input-output control circuit such as 44' or 55'. Input-output control circuit 44' includes MOSFET 44, which has its gate electrode connected to conductor 43' and its drain connected to sense-write conductor 50. MOSFET 44 has its source connected to data conductor 51. Input-output control circuit 44' also includes MOSFET 43 having its gate connected to conductor 43', its drain connected to sense-write conductor 28, and its source connected to data conductor 51. The other input-output control circuits, one associated with each row of the memory storage cells, are constructed entirely similarly. The source electrodes of all of the MOSFETs, such as 43, 44, 55, 56 are connected to the common data conductor 51. The gate electrodes of such MOSFETs are respectively coupled to row decode means 46 and 47 which in a practical implementation are split from each other so that half of the row decode circuitry is situated to the right side of sense amplifiers 45 and the other half is located to the left thereof.

The circuitry in row decode circuits 46 and 47 is also readily implementable by those skilled in the art and may be quite similar in structure to that in column decode circuitry 64 and 67. Control circuitry 57 is coupled to row decode circuitry 46 and 47, dummy storage cell decode circuitry 61 and 62, and column decode circuitry 64 and 67. Data input terminal 58 and data output terminal 59 are also connected to control circuitry 57, as is data conductor 51. Control circuitry 57 is intended to represent generalized timing, clocking, and input-output circuitry readily implementable by those skilled in the art of semiconductor memory design. See the above mentioned patent by Hoffman et al.

Column address inputs 91 are coupled to column decode circuit 64 and column address inputs 94 coupled to column decode circuit 67. There are M column address inputs where $2^M$ is the number of columns of storage cells in memory chip 10. Row address inputs 95 are coupled to row decode circuitry 46 and/or 47. There are N row address inputs if there are $2^N$ rows of storage cells in memory chip 10.

It should be pointed out that the structure and operation of MOSFETs is well known to those skilled in the semiconductor art. However, for a more detailed description of MOSFETs the reader may refer to Physics and Technology of Semiconductor Devices by A. S. Grove, John Wiley and Sons, Inc., 1967. It should be noted that as used herein the terms "source" and "drain" used with reference to the connections of MOSFETs, are interchangeable, since these electrodes of a MOSFET function as either sources or drains, depending upon bias conditions, since a MOSFET is a bilateral device as far as switching applications are concerned. It should also be pointed out that the acronym MOSFET is widely used to include all IGFET (insulated gate field effect transistors), including silicon gate field effect transistors. The same remark applies to the acronym CMOS.

The operation of memroy chip 10, as it relates to the inventive concept herein, is described with reference to the FIG. 2.

Any particular combination of the row selection and column selection address inputs results in the selection of one and only one storage cell, which may be in either array 12 or array 14. In other words, one column is selected and one row is selected; this results in selection of the storage cell at the intersection thereof.

Assume for purposes of discussion, that a logical "1" is stored at storage node 19' of storage cell 19. Storage cell 19 is selected by applying a logical "1" to column selection conductor 65 by means of column decode circuit 64. This accomplishes selection of the desired column. Prior to column selection, however, sense-write conductors 28 and 50 have been equilized in potential. This may be accomplished by means of complementary MOS transistor precharge circuitry, which may be associated with sense amplifier 45 or separate therefrom. When MOSFET 20 of storage cell 19 is turned on, the charge stored on storage capacitor 32 will be redistributed with charge stored on the capacitance of sense-write conductor 28, causing a sense voltage to appear on sense-write conductor 28. Also, some charge will be coupled between column selection conductors 65 and sense-write conductor 28 by parasitic capacitance between the gate and drain of MOSFET 20.

The operation of the memory circuit is such that whenever any column in array 12 is selected, dummy storage cell decode circuit 62 causes dummy storage cell selection conductor 63 to turn on all of the dummy storage cells connected thereto, so that the gate-to-drain parasitic capacitance associated with MOSFET 48' couples the same amount of charge onto sense-write conductor 50 as the gate-to-drain capacitance of MOSFET 20 couples onto sense-write conductor 28. Therefore, after all of the charge initially stored on storage capacitor 32 and the parasitic capacitance of sense-write conductor 28, is redistributed on storage capacitor 32, the voltage difference, (or lack of a voltage difference) between sense-write conductors 28 and 50 is due solely to the amount of charge representative of the stored logic state, initially stored on storage capacitor 32 of the selected storage cell 19.

Sense amplifier 45 is designed to be sensitive enough to detect this voltage difference as being indicative of an initially stored logical "1" or logical "0" in storage cell 19. Typically, the voltage difference for a stored logical "1" may be about 200 millivolts for the present state of the art, even though initially a voltage of the order of 15 or more volts different from the equalization voltage of the sense-write conductors was initially stored on the storage capacitance. This is because the capacitance of the storage capacitor, such as capacitor 32, is far smaller than the parasitic capacitance associated with the sense-write conductors.

Those skilled in the art will recognize that sense amplifier 45 is typically controlled by a read/write input to RAM 10, although such input is not discussed herein.

In order to increase the size of the voltage transition of a sense-write conductor corresponding to a stored logical state of the selected storage cell, it is very desirable that the circuitry coupled to the sense-write conductors to accomplish read and write operations add as little capacitance as possible. As explained in more detail hereinafter sense amplifier 45 acts to sense the small voltage transition and may regeneratively amplify it so that a large logical "1" or logical "0" voltage appears on sense-write conductor 50. Then, during the following portion of a read operation, the amplified voltage on sense-write conductor 50 is transferred or coupled to data conductor 51, which is then amplified and gated, by input or output circuitry associated with control circuitry 57, to data output terminal 59.

Row selection, as mentioned above is accomplished by means of a voltage applied to, for example, conductor 43' by row decode circuitry 46, thereby turning on MOSFET 44. During a writing operation, input data applied to data input terminal 58 is gated by circuitry in section 57 to data conductor 51 and is then coupled to the sense-write conductor 50 and is coupled to sense amplifier 45, overriding whatever state is stored therein, and from there is coupled to the opposite sense-write conductor and through MOSFET 20 to storage node 32 of selected storage cell 19.

Figure 3:
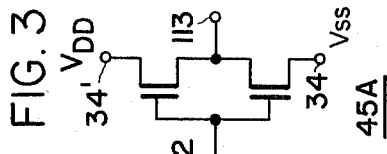
FIG. 3 is a schematic diagram of a complementary field effect transistor inverter.
Figure 1:
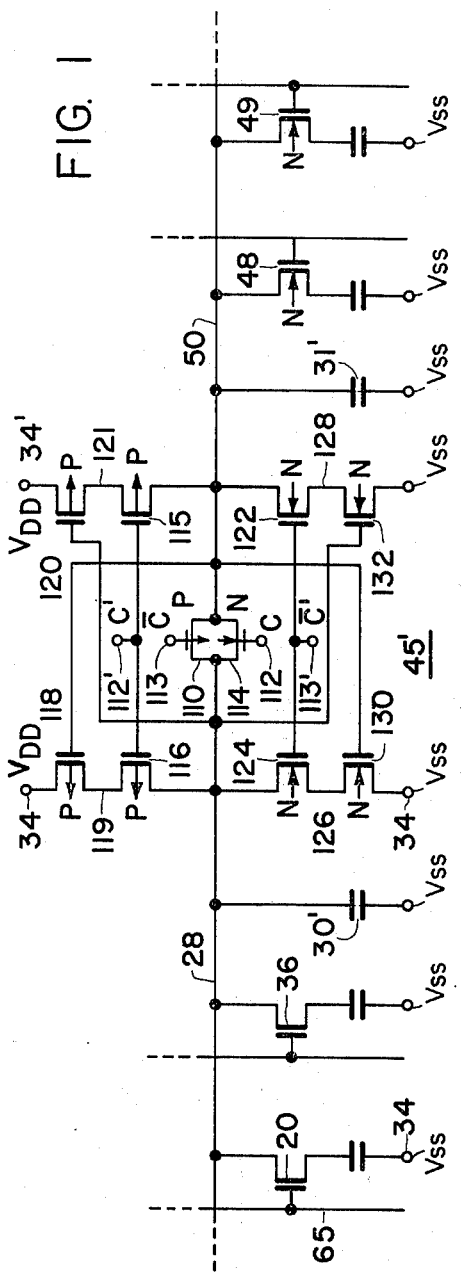
FIG. 1 is a schematic diagram of a complementary field-effect transistor amplifier according to the invention.

Referring now to FIG. 1, sense amplifier 45' is included in previously described sense amplifier 45 of FIG. 2. Sense amplifier 45' includes balancing or equalizing circuitry including P channel MOSFET 110 and N channel MOSFET 114 coupled in parallel between sense-write conductors 28 and 50. The gate of MOSFET 110 is connected to conductor 113, which has a clock signal designated $\overline{C}$ applied thereto. The gate of MOSFET 114 is connected to conductor 112, which has clock signal designated C applied thereto. The signals applied to conductors 113 and 112 can be generated externally or internally to semiconductor random access memory 10, or may be generated by a circuit such as 45A in FIG. 3 which is merely a conventional complementary field effect transistor inverter having the clock signal C applied to its input in generating complementary clock signal $\overline{C}$ at its output.

Sense amplifier circuit 45' also includes complementary isolation circuitry including P channel MOSFETs 115, 116 and N channel MOSFETs 122 and 124. MOSFET 115 has its drain connected to sense-write conductor 50, its gate connected to clock conductor 112' and its source connected to node 121. MOSFET 116 has its drain connected to sense-write conductor 28, its gate connected to clock conductor 112', and its source connected to node 119. MOSFET 122 has its drain connected to sense-write conductor 50, its gate connected to complementary clock conductor 113', and its source connected to node 128. MOSFET 124 has its drain connected to sense-write conductor 28, its gate connected to complementary clock conductor 113', and its source connected to node 126. The signals C' and $\overline{C}'$ applied to conductors 113 and 113' are delayed from C and $\overline{C}$ so that sense-write conductors 28 and 50 are electrically floating or isolated during the sensing charge redistribution operation described above.

Sense amplifier circuitry 45' also includes cross-coupled regenerative circuitry including P channel MOSFETS 118 and 120 and N channel MOSFETs 130 and 132. MOSFET 118 has its drain connected to node 119, its gate connected to sense-write conductor 50, and its source connected to $V_{DD}$ conductor 34'. MOSFET 120 has its drain connected to node 121, its gate connected to sense-write conductor 28, and its source connected to $V_{DD}$. MOSFET 130 has its source connected to node 126, its gate connected to sense-write conductor 50, and its source connected to $V_{SS}$ common voltage conductor 34. MOSFET 132 has its source connected to node 128, its gate connected to sense-write conductor 28, and its source connected to $V_{SS}$.

The operation of complementary sense amplifiers 45' is described as follows. Assume that sense-write conductors 28 and 50 are both precharged to approximately the same voltage by precharging circuitry (not shown) in sense amplifier circuitry 45 of FIG. 2. Also assume that this voltage is approximately midway between $V_{DD}$ and $V_{SS}$. The first thing that happens is that clock signal C is set to a logical "1", which would be approximately $V_{DD}$ volts, and $\overline{C}$ is set to a logical "0", or $V_{SS}$ volts. MOSFETs 110 and 114 are then both turned on, causing sense-write conductors 28 and 50 to be established at precisely the same voltage, since they will be electrically floating or isolated, and the charge associated with the capacitance thereof will be equally distributed between the two conductors. During this time P channel MOSFETs 115 and 116 and N channel MOSFETs 122 and 124 are off, completely isolating both sense-write conductors 28 and 50 from $V_{DD}$ and $V_{SS}$. Then, after the balancing operation is complete the next thing that happens is that a storage cell is selected. For purposes of explanation, assume that storage cell 19 is selected, and that a logical "1", i.e., $V_{DD}$ volts, is stored on storage capacitor 32. Then column selection conductor 65 goes to a logical "1" turning on N channel MOSFET 20. The charge stored on capacitor 32 is then redistributed to the capacitance 30' associated with sense-write conductor 28. The result is a small increase in voltage on sense-write conductor 28, since the capacitance of capacitor 30' is typically much greater than that of storage capacitor 32. As a result of this operation, the voltage of sense-write conductor 28 is typically 200 millivolts greater than the potential of sense-write conductor 50.

The next thing that happens is that clock signal C goes from $V_{DD}$ to $V_{SS}$ volts, turning off MOSFETs 110 and 114, thereby isolating sense-write conductors 28 and 50 from each other, leaving them electrically floating.

Then clock signal C' goes from a logical "1" to a logical "0" and $\overline{C}'$ goes from a logical "0" to a logical "1". Thus, MOSFETs 115, 116, 122, and 124 are all turned on, so that the two branches of the sense amplifier 45' are effectively cross-coupled, with node 28 being approximately 200 millivolts higher in voltage than node 50. If all of the field effect transistor geometries are symmetrically chosen for sense amplifier 45', the 200 millivolt difference is enough to cause the circuit to regeneratively and rapidly switch to a state in which sense-write conductor 28 is at $V_{DD}$ volts, and sense-write conductor 50 is at $V_{SS}$ volts. This re-establishes a potential of $V_{SS}$ volts on capacitor 32, thereby refreshing the stored state which was destructively read out. Column selection conductor 65 is then returned to a logical "0", and the sensing operation and refreshing operation is complete.

Provision of the complementary sense amplifier, as described above, substantially in the center of semiconductor chip 10 also provides chip layout, or topology, advantages in that a single elongated "tub" region, for example, an N-tub region, may be provided in the center of the chip, wherein all of the P channel IGFETs in the plurality of sense amplifiers 45, 52, etc., may be fabricated. Interconnection with the N channel IGFETs is thereby facilitated by means of relatively simple metallization interconnections.

In summary, the invention provides complementary field effect transistor sense amplifiers for a random access memory, which sense amplifiers are far more sensitive to small sense voltage transitions on the bit sense conductors than sense amplifiers of the prior art. Such sense amplifiers, according to the invention, dissipate no DC power, and consequently dissipate far less overall power than known sense amplifiers of the prior art.

What is claimed is:

1. A semiconductor random access memory comprising:
    a storage array including a plurality of storage cells;
    a first sense-write conductor coupled to a plurality of said storage cells for receiving data from and transferring data into any one of said storage cells when said one of said storage cells is selected, all of said storage cells including only field effect transistors of the same conductivity type;
    decode circuit means coupled to a plurality of said storage cells including one of said storage cells connected to said sense-write conductor for selecting storage cells coupled to said decode means by means of a first selection conductor;
    sense amplifier circuit means coupled to said first sense-write conductor for amplifying a sense signal imparted to said sense-write conductor by said selected storage cell and isolating said sense-write conductor so that it is electrically floating at times other than during a read operation or a write operation, and said sense amplifier circuit means including both P-channel and N-channel field effect transistors.

2. The semiconductor random access memory as recited in claim 1 wherein each of said storage cells comprises a MOSFET having its drain connected to a sense-write conductor, its gate connected to a selection conductor, and its source connected to one terminal of a storage capacitor having its other terminal connected to a common voltage conductor.

3. The semiconductor random access memory as recited in claim 1 including a second sense-write conductor coupled to a plurality of storage cells which are not connected to said first sense-write conductor or said first selection conductor, said second sense-write conductor also being coupled to said sense amplifier circuit means.

4. The semiconductor random access memory as recited in claim 3 further including a first dummy storage cell connected to said first sense-write conductor and a second dummy storage cell connected to said second sense-write conductor.

5. The semiconductor random access memory as recited in claim 4 wherein each of said dummy storage cells includes a MOSFET having its drain connected to a sense-write conductor, its gate connected to a dummy storage cell selection conductor, and its source connected to a storage capacitor having its other terminal connected to said common voltage conductor.

6. The semiconductor random access memory as recited in claim 3 further including sense-write conductor balancing circuit means coupled between said first and second sense-write conductors for equalizing potentials on said first and second sense-write conductors prior to selection of one of said storage cells in said semiconductor random access memory and then effectively isolating said first and second sense-write conductors from each other prior to imparting a signal to the one of said first and second sense-write conductors from said selected one of said storage cells, said sense-write conductor balancing circuit means including at least one N-channel field effect transistor and one P-channel field effect transistor.

7. The semiconductor random access memory as recited in claim 6 wherein said sense-write conductor balancing circuit means includes a P channel field effect transistor and an N channel field effect transistor coupled in parallel between said first sense-write conductor and said second sense-write conductor.

8. The semiconductor random access memory as recited in claim 7 further including clock means for providing a clock signal on a first clock conductor and a complementary clock signal on a second clock conductor, said first clock conductor being connected to the gate of said N channel field effect transistor and said second clock conductor being connected to the gate of said P channel field effect transistor.

9. The semiconductor random access memory as recited in claim 6 wherein said sense amplifier circuit means comprises cross coupled regenerative circuit means coupled to said first and second sense-write conductors for detecting a voltage difference between said first and second sense-write conductors representative of a sensed stored state of a selected storage cell and regeneratively assuming a state representative of said sensed stored state and amplifying a voltage representative of said sensed stored state on said sense-write conductor, said cross coupled regenerative circuit means including both P-channel field effect transistors and N-channel field effect transistors.

10. The semiconductor random access memory as recited in claim 9 wherein said isolation circuit means includes a first P channel field effect transistor having its drain connected to said first sense-write conductor, a second N channel field effect transistor having its drain connected to said first sense-write conductor, a third P channel field effect transistor having its drain connected to said first sense-write conductor, a third P channel field effect transistor having it drain connected to said second sense-write conductor and a fourth N channel field effect transistor having its drain connected to said second sense-write conductor, the gates of said first clock conductor and the gates of said second and fourth field effect transistors are connected to said second clock conductor, the source electrodes of said first and third field effect transistors being connected to said regenerative circuit means, said source electrodes of said second and fourth field effect transistors also being connected to said regenerative circuit means.

11. The semiconductor random access memory as recited in claim 9 wherein said sense amplifier circuit means comprises isolation circuit means coupled to said first and second sense-write conductors for isolating, respectively, said first and second sense-write conductors during said equalization of potential of said first and second sense-write conductors by means of said sense-write conductor balancing circuit means and coupling said first and second sense-write conductors to said cross coupled regenerative circuit means during sensing of a voltage representative of a sensed stored state, said isolation circuit means including both P-channel field effect transistor and N-channel field effect transistors.

12. The semiconductor random access memory as recited in claim 11 wherein said cross-coupled regenerative circuit means includes first and second P channel field effect transistors having their source electrodes coupled, respectively, to a second voltage conductor and third and fourth N channel field effect transistors having their source electrodes connected, respectively, to said common voltage conductor, the gate electrodes of said first and third field effect transistors being coupled to said second sense-write conductor and the gates of said second and fourth field effect transistors being coupled to said first sense-write conductor, the source electrodes of said first, second, third and fourth field effect transistors all being coupled, respectively, to said isolation circuit means.

13. A MOS semiconductor random access memory including first and second arrays of one-transistor storage cells arranged in rows and columns, all of said transistors being of the same conductivity type, each row of said one-transistor storage cells being coupled, respectively, to a connon sense-write conductor each column of said one-transistor storage cells being coupled, respectively, to a column selection conductor, a plurality of sense amplifiers, one for each row, each of said sense amplifiers coupled, respectively, between said sense-write conductor of one of said rows of said first array and a corresponding sense-write conductor of said one of said rows of said second array, a dummy storage cell connected, respectively, to each of said sense-write conductors of said MOS semiconductor random access memory, one of said sense amplifiers comprising:

complementary sense-write conductor balance circuit means coupled between first and second ones of said sense-write conductors for equalizing potentials on said first and second sense-write conductors prior to selection of one of said storage cells in said semiconductor random access memory and then effectively isolating said first and second sense-write conductors from each other prior to imparting a signal to the one of said first and second sense-write conductors from said selected one of said storage cells;

complementary cross-coupled regenerative circuit means coupled to said first and second sense-write conductors for detecting a voltage difference between said first and second sense-write conductors representative of a sensed stored state of a selected storage cell and regeneratively assuming a state representative of said sensed stored state and amplifying a voltage representative of said sensed stored state on said sense-write conductor; and complementary isolation circuit means coupled to said first and second sense-write conductors for effectively isolating, respectively, said first and second sense-write conductors during said equalization of potential on said first and second sense-write conductors during said equalization of potential on said first and second sense-write conductors by means of said complementary sense-write conductor balance circuit means during sensing of a voltage representative of said sensed stored state.

14. A method of operating a semiconductor random access memory comprising the steps of:

equalizing the potential of a pair of sense-write conductors while said sense-write conductors are effectively electrically isolated from any electrically conducting path through a complementary field effect transistor sense amplifier connected to each pair of sensewrite conductors;

effectively electrically isolating said sense-write conductors from any electrically conducting path therebetween through balancing circuit means for accomplishing said equalizing of said potentials;

redistributing charge representative of a stored logical state between a selected storage cell coupled to one of said sense-write conductors and said one of said sense-write conductors thereby causing a relatively small voltage transition representative of said stored state on said one sense-write conductor;

operatively coupling said pair of sense-write conductors to a regenerative portion of said complementary field effect transistor sense amplifier for amplifying said voltage transition and refreshing said selected storage cell.

* * * * *